(12) United States Patent
Chou et al.

(10) Patent No.: US 9,536,834 B2
(45) Date of Patent: *Jan. 3, 2017

(54) REVERSE DAMASCENE PROCESS

(71) Applicant: Taiwan Semiconductor Manufacturing Co., Ltd., Hsin-Chu (TW)

(72) Inventors: You-Hua Chou, Taipei (TW); Min Hao Hong, Kaohsiung (TW); Jian-Shin Tsai, Tainan (TW); Miao-Cheng Liao, Yunlin (TW); Hsiang Hsiang Ko, Tainan County (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 13/905,498

(22) Filed: May 30, 2013

(65) Prior Publication Data
US 2013/0260552 A1 Oct. 3, 2013

Related U.S. Application Data

(63) Continuation of application No. 13/234,299, filed on Sep. 16, 2011, now Pat. No. 8,518,818.

(51) Int. Cl.
*H01L 21/768* (2006.01)
*H01L 23/532* (2006.01)

(52) U.S. Cl.
CPC ....... *H01L 23/53238* (2013.01); *H01L 21/768* (2013.01); *H01L 21/76852* (2013.01);
(Continued)

(58) Field of Classification Search
CPC ............ H01L 21/768; H01L 21/76841; H01L 21/76852; H01L 21/76885; H01L 23/53238; H01L 23/5329; H01L 2924/00; H01L 2924/0002
(Continued)

(56) References Cited

U.S. PATENT DOCUMENTS 4,614,021 A 9/1986 Hulseweh
4,732,865 A 3/1988 Evans et al.
(Continued)

OTHER PUBLICATIONS

U.S. Appl. No. 13/967,409, filed Aug. 15, 2013. 34 Pages.
(Continued)

*Primary Examiner* — Mary Wilczewski
(74) *Attorney, Agent, or Firm* — Eschweiler & Associates, LLC

(57) ABSTRACT

The present disclosure relates to a method of forming a back-end-of-the-line metallization layer. The method is performed by forming a plurality of freestanding metal layer structures (i.e., metal layer structures not surrounded by a dielectric material) on a semiconductor substrate within an area defined by a patterned photoresist layer. A diffusion barrier layer is deposited onto the metal layer structure in a manner such that the diffusion barrier layer conforms to the top and sides of the metal layer structure. A dielectric material is formed on the surface of the substrate to fill areas between metal layer structures. The substrate is planarized to remove excess metal and dielectric material and to expose the top of the metal layer structure.

20 Claims, 10 Drawing Sheets

(52) U.S. Cl.
CPC .... *H01L 21/76885* (2013.01); *H01L 23/5329* (2013.01); *H01L 21/76841* (2013.01); *H01L 2924/0002* (2013.01)

(58) Field of Classification Search
USPC ............... 438/626, 627, 687, 592, 688, 643
See application file for complete search history.

(56) References Cited

U.S. PATENT DOCUMENTS

| | | | |
|---|---|---|---|
| 4,810,332 A | 3/1989 | Pan | |
| 4,873,565 A | 10/1989 | Roane | |
| 5,071,518 A | 12/1991 | Pan | |
| 5,084,412 A | 1/1992 | Nakasaki | |
| 5,270,259 A | 12/1993 | Ito et al. | |
| 5,312,512 A | 5/1994 | Allman et al. | |
| 5,354,712 A * | 10/1994 | Ho et al. | 438/643 |
| 5,391,517 A * | 2/1995 | Gelatos | H01L 21/32051 257/E21.295 |
| 5,486,492 A | 1/1996 | Yamamoto et al. | |
| 5,556,801 A | 9/1996 | Hawkins et al. | |
| 5,674,787 A * | 10/1997 | Zhao et al. | 438/627 |
| 5,698,465 A * | 12/1997 | Lynch et al. | 438/125 |
| 5,702,981 A | 12/1997 | Maniar et al. | |
| 5,789,320 A * | 8/1998 | Andricacos et al. | 438/678 |
| 5,792,705 A | 8/1998 | Wang et al. | |
| 5,854,125 A | 12/1998 | Harvey | |
| 5,898,222 A | 4/1999 | Farooq et al. | |
| 5,933,753 A * | 8/1999 | Simon et al. | 438/629 |
| 5,953,634 A * | 9/1999 | Kajita | C23C 16/0272 257/E21.295 |
| 6,001,415 A | 12/1999 | Nogami et al. | |
| 6,004,873 A | 12/1999 | Jang et al. | |
| 6,017,816 A * | 1/2000 | Ni | H01L 21/0276 257/E21.029 |
| 6,033,982 A * | 3/2000 | Lopatin | H01L 21/31687 257/664 |
| 6,037,257 A * | 3/2000 | Chiang | C23C 14/024 257/762 |
| 6,048,445 A | 4/2000 | Brain | |
| 6,063,506 A * | 5/2000 | Andricacos et al. | H01L 23/49822 174/126.1 |
| 6,077,780 A * | 6/2000 | Dubin | H01L 21/76834 257/E21.584 |
| 6,083,842 A | 7/2000 | Cheung et al. | |
| 6,140,222 A | 10/2000 | Bollinger et al. | |
| 6,143,652 A * | 11/2000 | Yu | H01L 21/02071 216/102 |
| 6,165,890 A * | 12/2000 | Kohl | H01L 21/7682 257/E21.581 |
| 6,174,811 B1 * | 1/2001 | Ding | C23C 14/0641 257/E21.584 |
| 6,180,511 B1 * | 1/2001 | Kim et al. | 438/626 |
| 6,184,143 B1 | 2/2001 | Ohashi et al. | |
| 6,232,230 B1 * | 5/2001 | Iacoponi | H01L 21/7681 257/E21.579 |
| 6,271,112 B1 | 8/2001 | Wooten et al. | |
| 6,293,457 B1 * | 9/2001 | Srivastava et al. | 228/254 |
| 6,294,463 B1 | 9/2001 | Tseng | |
| 6,303,495 B2 * | 10/2001 | Mori | C23C 16/18 257/E21.295 |
| 6,331,481 B1 | 12/2001 | Stamper et al. | |
| 6,342,447 B1 * | 1/2002 | Hoshino | 438/687 |
| 6,342,448 B1 * | 1/2002 | Lin | H01L 21/28568 257/E21.168 |
| 6,372,670 B1 | 4/2002 | Maeda | |
| 6,432,794 B1 | 8/2002 | Lou | |
| 6,440,854 B1 * | 8/2002 | Rozbicki | H01L 21/2855 257/E21.169 |
| 6,444,565 B1 | 9/2002 | Feild et al. | |
| 6,465,343 B1 | 10/2002 | Wang | |
| 6,492,197 B1 * | 12/2002 | Rinne | 438/108 |
| 6,518,184 B1 * | 2/2003 | Chambers et al. | 438/687 |
| 6,541,374 B1 * | 4/2003 | de Felipe | H01L 21/28556 257/E21.17 |
| 6,562,715 B1 * | 5/2003 | Chen | C23C 16/34 204/192.17 |
| 6,566,246 B1 * | 5/2003 | de Felipe | H01L 21/2855 257/E21.169 |
| 6,586,322 B1 * | 7/2003 | Chiu et al. | 438/612 |
| 6,605,534 B1 * | 8/2003 | Chung et al. | 438/674 |
| 6,607,977 B1 * | 8/2003 | Rozbicki | H01L 21/76805 438/597 |
| 6,627,542 B1 * | 9/2003 | Gandikota | H01L 21/76843 257/E21.585 |
| 6,642,146 B1 * | 11/2003 | Rozbicki | H01L 21/76805 438/622 |
| 6,656,836 B1 * | 12/2003 | Wang | H01L 21/2855 257/E21.169 |
| 6,670,271 B1 * | 12/2003 | Subramanian | H01L 21/288 257/E21.174 |
| 6,727,176 B2 * | 4/2004 | Ngo et al. | 438/660 |
| 6,730,594 B2 | 5/2004 | Noguchi et al. | |
| 6,831,003 B1 * | 12/2004 | Huang | H01L 21/7682 257/E21.581 |
| 6,905,950 B2 * | 6/2005 | Subramanian et al. | 438/586 |
| 6,943,101 B2 | 9/2005 | Brintzinger | |
| 7,008,867 B2 * | 3/2006 | Lei | 438/613 |
| 7,067,424 B2 * | 6/2006 | Wolters et al. | 438/687 |
| 7,104,869 B2 | 9/2006 | Tsai et al. | |
| 7,135,770 B2 * | 11/2006 | Nishiyama et al. | 257/734 |
| 7,157,370 B2 | 1/2007 | Inoue et al. | |
| 7,220,680 B1 * | 5/2007 | Lin | G03F 7/40 257/347 |
| 7,238,607 B2 * | 7/2007 | Dunton et al. | 438/626 |
| 7,405,154 B2 * | 7/2008 | Cabral et al. | 438/630 |
| 7,452,804 B2 | 11/2008 | Beck et al. | |
| 7,615,407 B1 * | 11/2009 | Poddar et al. | 438/106 |
| 7,786,581 B2 * | 8/2010 | Kang et al. | 257/737 |
| 7,838,921 B2 | 11/2010 | Willer et al. | |
| 7,955,964 B2 | 6/2011 | Wu et al. | |
| 8,242,011 B2 * | 8/2012 | Lim et al. | 438/613 |
| 8,354,347 B2 * | 1/2013 | Ye et al. | 438/735 |
| 8,492,891 B2 * | 7/2013 | Lu et al. | 257/737 |
| 8,518,818 B2 * | 8/2013 | Chou et al. | 438/614 |
| 8,552,559 B2 * | 10/2013 | Lin | H01L 21/76829 257/503 |
| 8,569,897 B2 * | 10/2013 | Liu et al. | 257/781 |
| 8,609,526 B2 * | 12/2013 | Liu et al. | 438/614 |
| 8,932,951 B2 | 1/2015 | Wu et al. | |
| 9,029,260 B2 * | 5/2015 | Lin | H01L 21/76885 257/E21.575 |
| 2001/0027014 A1 * | 10/2001 | Sun | H01L 21/76885 438/675 |
| 2003/0109129 A1 | 6/2003 | Saito et al. | |
| 2003/0116439 A1 | 6/2003 | Seo et al. | |
| 2003/0183940 A1 | 10/2003 | Noguchi et al. | |
| 2004/0159874 A1 | 8/2004 | Tsuchiya et al. | |
| 2004/0185653 A1 | 9/2004 | Nagano et al. | |
| 2004/0212009 A1 | 10/2004 | Wang et al. | |
| 2004/0224496 A1 | 11/2004 | Cui et al. | |
| 2005/0272257 A1 * | 12/2005 | Fuchs | H01L 23/041 438/643 |
| 2006/0022343 A1 * | 2/2006 | Lin | H01L 21/76829 257/758 |
| 2007/0099432 A1 * | 5/2007 | Lin | G03F 7/40 438/740 |
| 2007/0190784 A1 * | 8/2007 | Cui | H01L 21/76825 438/687 |
| 2007/0281476 A1 * | 12/2007 | Lavoie | C23C 16/18 438/687 |
| 2008/0079169 A1 | 4/2008 | Maekawa | |
| 2008/0242088 A1 * | 10/2008 | Suzuki | H01L 21/76843 438/687 |
| 2009/0127632 A1 | 5/2009 | Pas | |
| 2009/0286394 A1 | 11/2009 | Ko et al. | |
| 2010/0130001 A1 | 5/2010 | Noguchi | |
| 2011/0076390 A1 * | 3/2011 | Cerio, Jr. | C23C 18/161 427/96.8 |
| 2011/0092064 A1 * | 4/2011 | Liu et al. | 438/612 |

(56) References Cited

U.S. PATENT DOCUMENTS

| | | | |
|---|---|---|---|
| 2011/0101527 A1* | 5/2011 | Cheng et al. | 257/738 |
| 2012/0001321 A1 | 1/2012 | Imamura et al. | |
| 2012/0080792 A1 | 4/2012 | Zhao | |
| 2012/0091577 A1* | 4/2012 | Hwang et al. | 257/737 |
| 2012/0164095 A1 | 6/2012 | Puerta et al. | |
| 2013/0260552 A1* | 10/2013 | Chou et al. | 438/627 |
| 2013/0328198 A1* | 12/2013 | Chou et al. | 257/751 |
| 2014/0030888 A1 | 1/2014 | Wu et al. | |

OTHER PUBLICATIONS

Naoto Kikuchi, et al., "Preparation of Amorphous $Si_{1-x}C_x$ ($0<x<1$) Films by Alternate Deposition of Si and C Thin Layers Using a Dual Magnetron Sputtering Source", Surface and Coatings Technology 149, 2002, p. 76-81.

Yuko Nishimoto, et al., "Nitrogen-Free Cu Barrier SiOCH Film With K=4.3", Semiconductor Processing Laboratory Co., Ltd. National Institute of Advanced Industrial Science and Technology, p. 1.

Ken-ichi Takeda, et al., "New Dielectric Barrier for Damascene Cu Interconnection: Trimethoxysilane-Based $SiO_2$ Film with k=3.9", IEEE 2001, p. 244-246.

Chiu-Chih Chiang, et al., "Physical and Barrier Properties of Amorphous Silicon-Oxycarbide Deposited by PECVD from Octamethylcyclotetrasiloxane", Journal of the Electrochemical Society, 151 (9), 2004, p. G612-G617.

Non-Final Office Action dated Jul. 19, 2012 for U.S. Appl. No. 13/234,299. 27 Pages.

Final Office Action dated Jan. 14, 2013 for U.S. Appl. No. 13/234,299. 16 Pages.

Notice of Allowance dated Apr. 30, 2013 for U.S. Appl. No. 13/234,299.

Non Final Office Action Dated Sep. 8, 2014 U.S. Appl. No. 13/967,409.

Final Office Action Dated Mar. 4, 2015 U.S. Appl. No. 13/967,409.

Non-Final Office Action dated Jun. 19, 2015 in connection with U.S. Appl. No. 13/967,409.

Final Office Action Dated Nov. 13, 2015 U.S. Appl. No. 13/967,409.

Notice of Allowance Dated Mar. 28, 2016 U.S. Appl. No. 13/967,409.

* cited by examiner

REVERSE DAMASCENE PROCESS

REFERENCE TO RELATED APPLICATION

This application is a continuation of U.S. application Ser. No. 13/234,299 filed on Sep. 16, 2011.

BACKGROUND

Modern day integrated chips contain millions of semiconductor devices. The semiconductor devices are electrically interconnected by way of back-end-of-the-line metallization layers that are formed above the devices on an integrated chip. A typical integrated chip comprises a plurality of back-end-of-the-line metallization layers including different sized metal wires vertically coupled together with metal contacts (e.g., vias).

Back-end-of-the-line metallization layers are often formed using a dual damascene process. In a dual damascene process, a dielectric material is deposited (e.g., low k dielectric, ultra low k dielectric) onto the surface of a semiconductor substrate. The dielectric material is then selectively etched to form cavities in the dielectric material for a via layer and for an adjoining metal layer. In a typical via-first dual damascene process, a via hole is first etched through two dielectric layers separated by an etch stop layer. A metal line trench is then formed on top of the via hole. After the via and trench are formed, a diffusion barrier layer and a seed layer are deposited within the cavities. An electro chemical platting process is then used to fill the via and metal trenches with metal (e.g., copper) at the same time. Finally, the surface of the substrate is planarized using a chemical mechanical polishing process to remove any excess metal.

The dual damascene process is subject to a number of potential etching defects that may affect the quality of the metallization layers. For example, to prevent a metal line trench from further etching the underlying via hole, a photoresist plug is inserted in the via hole before the metal line trench is etched. If the photoresist plug is formed to a height that is too high, the dielectric material may be under-etched leaving fence defects. In contrast, if the photoresist plug is formed to a height that is too low, the dielectric material may be over-etched leaving facet defects. Also, etching may damage the dielectric material during PR stripping (e.g., damage to the dielectric trench side-wall) or enhance the nodule shape (e.g., fringed metal line edges) caused by standing waves produced in the resist layer as a result of interference between incoming and the reflected light used in photolithography processes. Such etching defects may result in voids or pit defects that negatively affect the reliability of metal interconnect wires.

SUMMARY OF THE INVENTION

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present some concepts of the invention in a simplified form as a prelude to the more detailed description that is presented later.

In one embodiment, the present disclosure relates to a method of forming a back-end-of-the-line metallization layer. The method is performed by forming a plurality of freestanding metal layer structures on a semiconductor substrate within an area defined by a patterned photoresist layer. A diffusion barrier layer is deposited onto the substrate which conforms to top and side surfaces of the metal layer structures. An inter-level dielectric material onto the surface of the substrate to fill areas between metal layer structures. Finally, the substrate is planarized to remove excess metal and inter-level dielectric material and to expose the top of the metal layer structures.

In one embodiment, the present disclosure relates to a method of forming a back-end-of-the-line metallization layer. The method is performed by depositing an under metal metallurgy (UMM) layer on the surface of the substrate. A patterned positive tone photoresist layer above the UMM layer having a plurality of cavities extending from the top of the photoresist layer defining a metallization layer that is to be formed, wherein the UMM seed layer extends along only the bottom surface of the cavities. A metal is grown from the UMM layer to fill the plurality of cavities with the metal. The positive tone photoresist is removed from the substrate to leave freestanding metal structures on the surface of the substrate at locations of the cavities. A diffusion barrier layer is deposited onto the substrate that conforms to top and side surfaces of the freestanding metal structures. An inter-level dielectric material is deposited onto the surface of the substrate to fill areas between the freestanding metal structures. Finally, the substrate is planarized to remove excess metal and inter-level dielectric material.

The following description and annexed drawings set forth in detail certain illustrative aspects and implementations of the invention. These are indicative of but a few of the various ways in which the principles of the invention may be employed.

DETAILED DESCRIPTION

Figure 1:
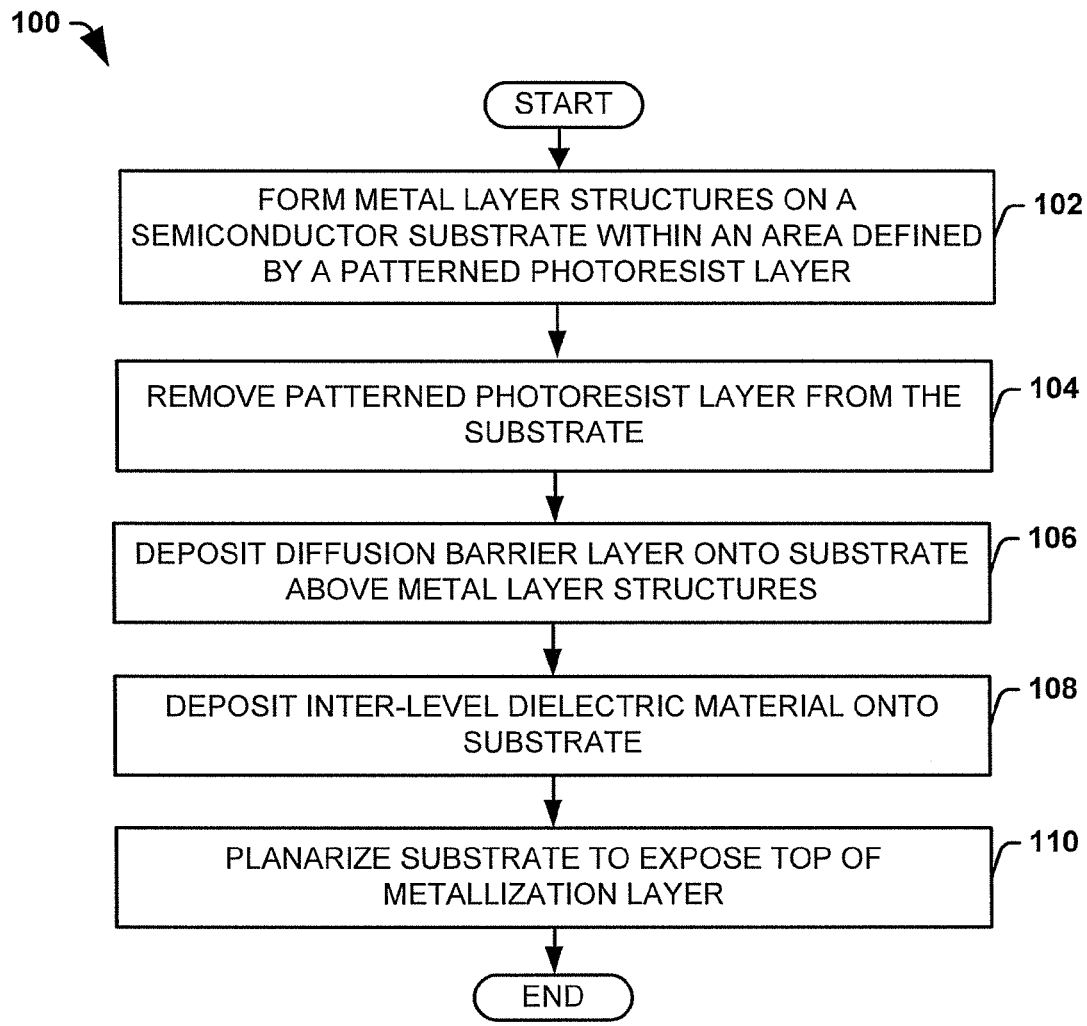
FIG. 1 is a flow diagram illustrating an example methodology for forming a metallization layer using a reverse damascene process provided herein.

The description herein is made with reference to the drawings, wherein like reference numerals are generally utilized to refer to like elements throughout, and wherein the various structures are not necessarily drawn to scale. In the following description, for purposes of explanation, numerous specific details are set forth in order to facilitate understanding. It may be evident, however, to one skilled in the art, that one or more aspects described herein may be practiced with a lesser degree of these specific details. In other instances, known structures and devices are shown in block diagram form to facilitate understanding.

Some aspects of the present disclosure provide for a method of forming a back-end-of-the-line metallization layer using a reverse damascene process in which freestanding metal layer structures are formed on a substrate in areas defined by a patterned photoresist prior to the deposition of an inter-level dielectric material that fills in areas between the metal layer structures. By forming the freestanding metal layer structures prior to the deposition of an inter-level dielectric material, etching problems associated with traditional damascene processes are reduced.

In one embodiment, the method comprises depositing a under metal metallurgy (UMM) layer onto a surface of a semiconductor substrate. A patterned photoresist layer is formed onto the UMM layer to define an area where the structure of the metal layer (e.g., the via or metal line) is to be formed. The resulting photoresist layer comprises a plurality of cavities, extending from the top of the photoresist layer to the underlying UMM layer, which serve a mold in which a metal layer can be grown from the underlying UMM seed layer. A platting process is then performed to generate a metal layer structure from the UMM layer. The plating process forms the metal layer structure by filing cavities (e.g., holes or trenches) within the photoresist. The photoresist is subsequently removed and the UMM layer is etched away, leaving a freestanding metal layer structure (i.e., a metal layer structure not surrounded by dielectric material). A diffusion barrier layer is deposited onto the metal layer structure before a dielectric material is applied to the substrate. The substrate is then planarized to expose the top of the metal layer structure. Therefore, the method operates to grow a single metal layer (e.g., a single metal via layer or a single metal line layer) from a seed layer defined by a patterned photoresist, before a dielectric material is deposited.

FIG. 1 illustrates an exemplary method 100 for forming a single back-end-of-the-line metallization layer using a reverse damascene process provided herein. While the methods provided herein (e.g., methods 100, 200, 500) are illustrated and described below as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

At 102, metal layer structures having an under metal metallurgy (UMM) layer are formed on a semiconductor substrate within an area defined by a patterned photoresist layer. The metal layer structures is formed using a plating process that generates the metal layer structures from an under metal metallization (UMM) seed layer. The patterned photoresist is used to define the area of the metal layer structures. In one embodiment, the patterned photoresist may sit on the UMM seed layer and comprise cavities defining the location of the metal layer structures, which are filled by a plating process (i.e., the photoresist layer acts as a mold). In an alternative embodiment, the photoresist may sit on a plated metal layer and act as a mask for subsequent etching that defines the location of the metal layer structures.

The metal layer structures may comprise any metal material. In one embodiment, the UMM layer has a diffusion barrier function to prevent diffusion of the metal into underlying dielectric material. In another embodiment, the UMM layer is formed above a barrier dielectric film disposed on the substrate.

The patterned photoresist layer is removed, at 104. The removal of the photoresist leaves a freestanding exposed metal layer structure.

At 106, a diffusion barrier layer is deposited onto the substrate above the exposed metal layer structure. The diffusion barrier layer blocks diffusion of the metal layer structures into adjacent dielectric material (e.g., deposited in step 108). The diffusion barrier layer is deposited to conform to the surface (e.g., the top and the sidewalls) of the exposed metal layer structures.

At 108, an inter-level dielectric material is deposited onto the surface of the substrate. The inter-level dielectric material is formed on the substrate in a manner that fills in the area between the freestanding metal layer structures. In one embodiment, the inter-level dielectric material is formed to enclose the metal layer structures. Since the inter-level dielectric material is formed above the diffusion barrier layer, diffusion of the metal layer structures into the inter-level dielectric material is prevented.

At 110, the substrate is planarized. Planarization of the substrate removes excess dielectric and metal material from the substrate to achieve a metallization layer having an appropriate height and a planarized surface upon which subsequent metallization layers may be formed.

Therefore, method 100 generates a metallization layer by first forming the metal layer structures and then by subsequently applying a barrier layer and inter-level dielectric material to the metal layer structures. One of ordinary skill in the art will appreciate that because the inter-level dielectric material is formed onto the metal layer structures, the etching problems present in traditional dual damascene processes (e.g., overetching the ULK, facet defects, fence defects, etc.) are eliminated.

Figure 2:
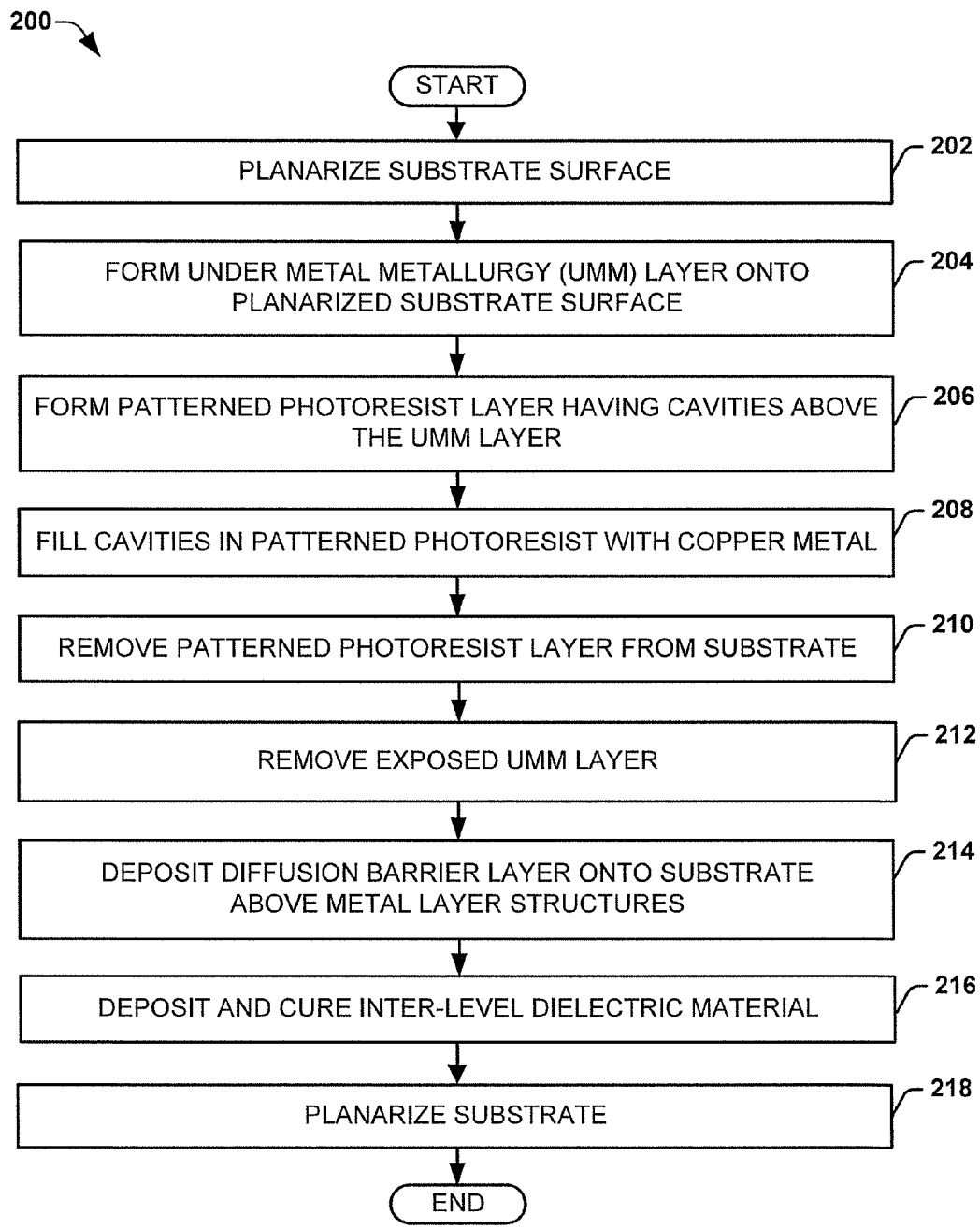
FIG. 2 is a flow diagram illustrating a more detailed example methodology for forming a metallization layer using a reverse damascene process provided herein.

FIG. 2 illustrates a more detailed embodiment of a method 200 for forming a single back-end-of-the-line metallization layer using a reverse damascene process. An example semiconductor substrate whereon such a methodology is implemented is illustrated in cross-sectional view in FIGS. 3A-3I.

Although method 200 is often described in relation to the formation of a copper metallization layer it will be appreciated that the method may be used for metallization layers formed with different types of metals. For example, in various embodiments, the metallization layer may comprise aluminum, tungsten, molybdenum, titanium, titanium nitride, tantalum nitride, or a metal silicide, for example.

At 202, the surface of a semiconductor substrate is planarized. In one embodiment, the surface of the semiconductor substrate is planarized using a chemical mechanical polishing (CMP) process. The CMP process planarizes the surface of the semiconductor substrate by removing excess material from the surface of the substrate that remain after prior processing steps.

Figure 3A:
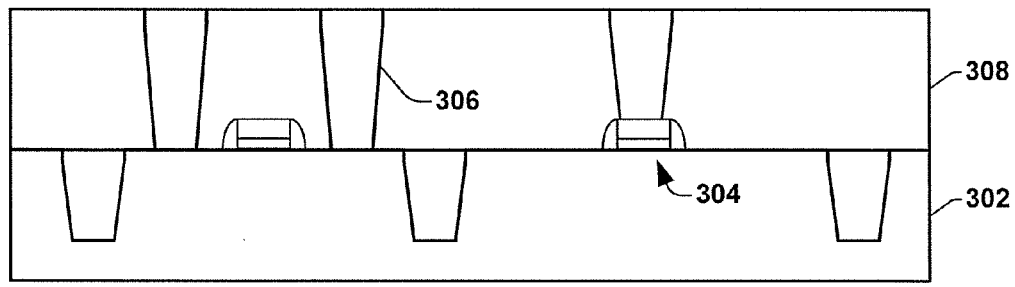
FIGS. 3A-3I are cross-sectional views of an example semiconductor substrate upon which a back end metallization layer is formed using the method of FIG. 2.

As shown cross sectional view 300 of FIG. 3A, the CMP process forms a substantially flat substrate surface by removing any excess dielectric material 308 and/or metal (e.g., W) from a lower layer comprising a metal contact layer 306 making contact with the underlying devices 304 located in a silicon substrate 302.

At 204, an under metal metallurgy layer (UMM) is formed on the planarized substrate surface. The UMM layer operates as a seed layer. In various embodiments, the UMM comprises materials having a relatively low resistance to reduce resistance and improve RC performance. In one particular embodiment, the UMM layer operates as a copper metal seed layer, for example.

In one embodiment, the UMM layer has a copper barrier function to prevent diffusion of copper metal into underlying dielectric material. In another embodiment, the UMM layer is distinct from an underlying copper barrier dielectric film. The copper barrier dielectric film is deposited between a dielectric layer and the UMM layer and is configured to prevent diffusion of the copper into the dielectric layer. In one embodiment, the copper barrier dielectric film may comprise Trimethoxysilane-based silicon dioxide ($SiO_2$), and can be deposited by a plasma enhanced chemical vapor deposition process (PE-CVD process) around 350° C. In an alternative embodiment, the copper barrier layer may comprise a N-free Cu Barrier SiOCH film with k=4.3.

Figure 3B:
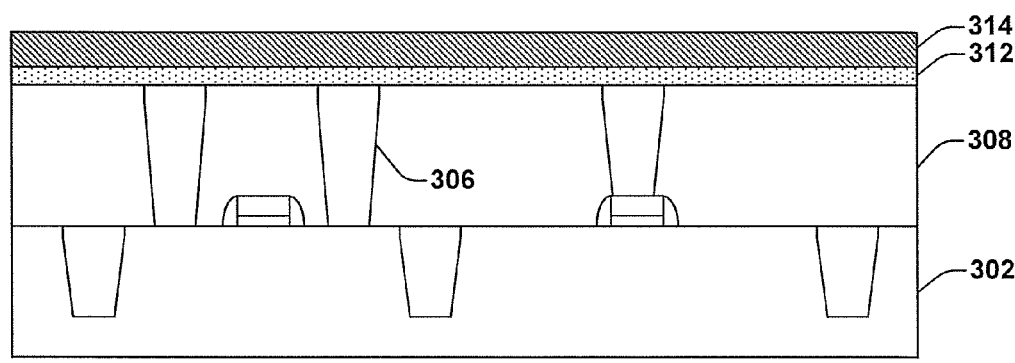

As illustrated in cross sectional view 310 of FIG. 3B, a UMM layer 314 is formed on the surface of the semiconductor substrate. The UMM layer 314 is in electrical contact with the underlying metal contact layer 306. In one embodiment, a separate copper barrier layer 312 is formed between the underlying dielectric material 308 and the overlying UMM layer 314. The UMM layer 314 is formed to have a substantially constant thickness over the surface of the substrate.

At 206, a patterned photoresist layer having a plurality of cavities is formed on the surface of the substrate above the UMM layer. The patterned photoresist layer is formed by depositing photoresist onto the surface of the substrate and then patterning the deposited photoresist to form cavities defining a platting area where the metal layer structures of the metallization layer (e.g., the via or metal line) are to be formed. In one embodiment, a light sensitive positive tone photoresist is applied to the surface of the substrate by spin coating the substrate with the photoresist at a high RPM. The positive tone photoresist is then selectively exposed to a light source (e.g., UV light) using a photolithography exposure tool. The light causes exposed portions of the positive tone photoresist coating to become more soluble, while portions of the positive tone photoresist that are unexposed remain insoluble to the photoresist developer. A developer is then used to remove the more soluble areas leaving the patterned resist with a structure with cavities that define the platting area where the metal structure is to be formed.

The use of a positive tone photoresist avoids the thermal expansion or shrinkage of negative photoresist, improving critical dimension control. The type of positive tone photoresist used will vary by layer and should be appropriate for the height of the metallization layer to be formed. For example, a photoresist having a thickness of approximately 100 nm can used to form a metal lines or contracts having a height of 100 nm or less. One of ordinary skill in the art will appreciate that various photoresist thicknesses may be achieved by using different types of photoresist and/or by varying the spin speed used during application of the photoresist.

Figure 3C:
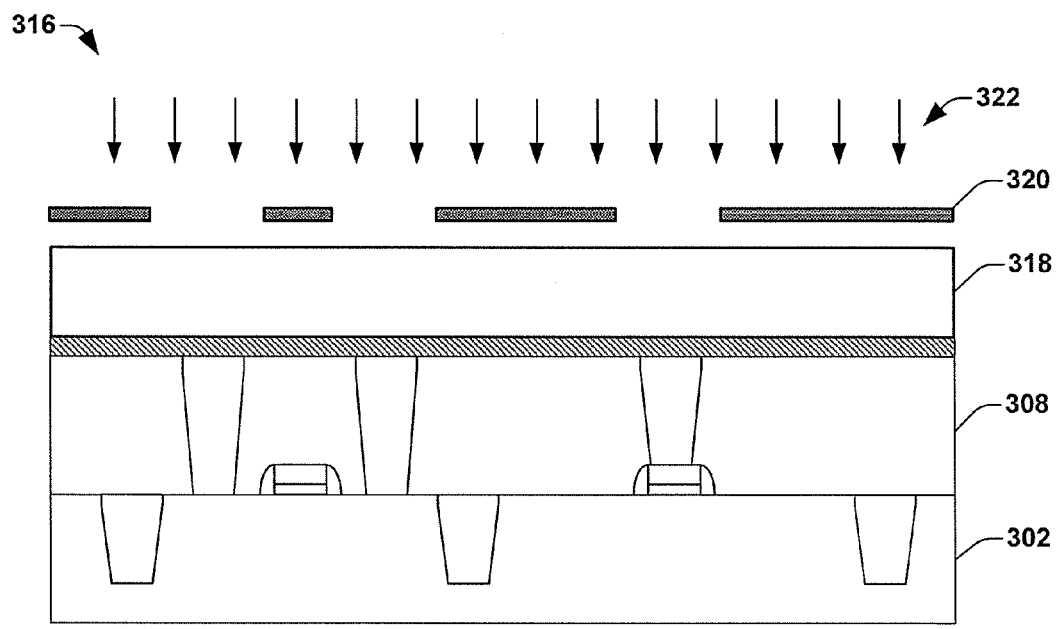

FIG. 3C illustrates a cross sectional view of a semiconductor substrate 316 having a positive tone photoresist 318 selectively exposed to a light source 322 (e.g., UV light) by way of a photolithography exposure mask 320. The photolithography exposure mask 320 causes exposure of the positive tone photoresist in areas in which metal layer structures are to be formed.

Figure 3D:
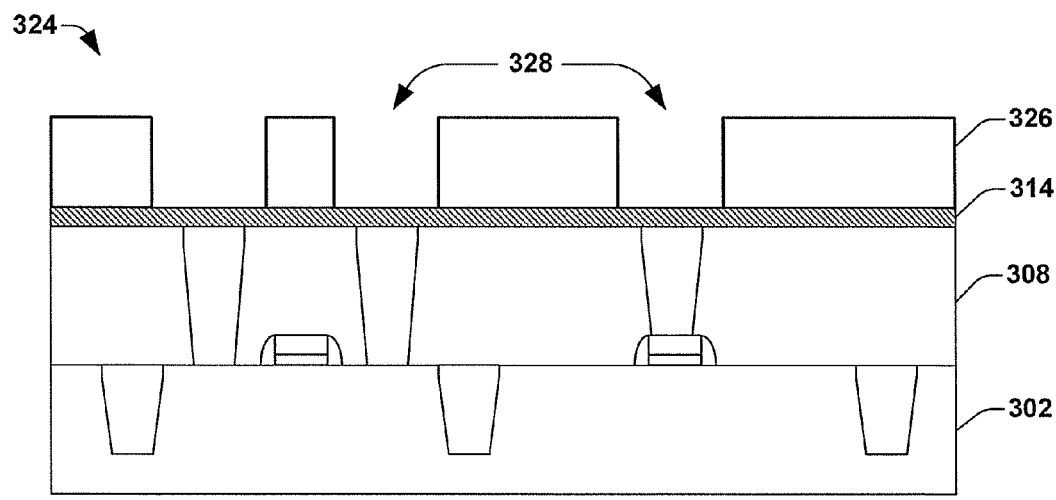

FIG. 3D illustrates a cross sectional view of a resulting semiconductor substrate 324 having a patterned photoresist layer 326 located on top of the UMM layer 314. The patterned photoresist layer 326 has a plurality of cavities 328 defining the metal layer structures that are to be formed. The cavities 328 extend from the top surface of the patterned photoresist layer 326 to the bottom surface of the patterned photoresist layer 326, thereby exposing the underlying UMM layer 314. If the metallization layer to be formed is a contact/via layer, the cavities 328 will comprise holes having a diameter that is essentially equal to the size of the vias to be formed. If the metallization layer to be formed is a metal line layer, the cavities 328 will comprise a trench having a width essentially equal to the width of the metal lines to be formed.

The cavities in the patterned photoresist layer are filled, at 208. In one embodiment, the cavities are filled by growing a copper metal from the UMM layer to fill the cavities. In one embodiment, a copper metal layer is formed using an electro chemical platting process (electroplating process). As one of ordinary skill in the art will appreciate, during the electroplating process, a charge is applied to a substrate that is exposed to an electroplating solution containing copper ions. The charged substrate attracts the copper ions, causing the ions to collect on the surface of the substrate and build a thick layer of the copper metal. Such a platting process will grow thick layers of copper metal in areas of the UMM layer that are exposed by the patterned photoresist, thereby filling the cavities of the patterned photoresist layer to form metal layer structures. In other words, the patterned photoresist layer operates as a mold that shapes the metal layer is shaped according to the plurality of cavities in the patterned positive tone photoresist layer.

Figure 3E:
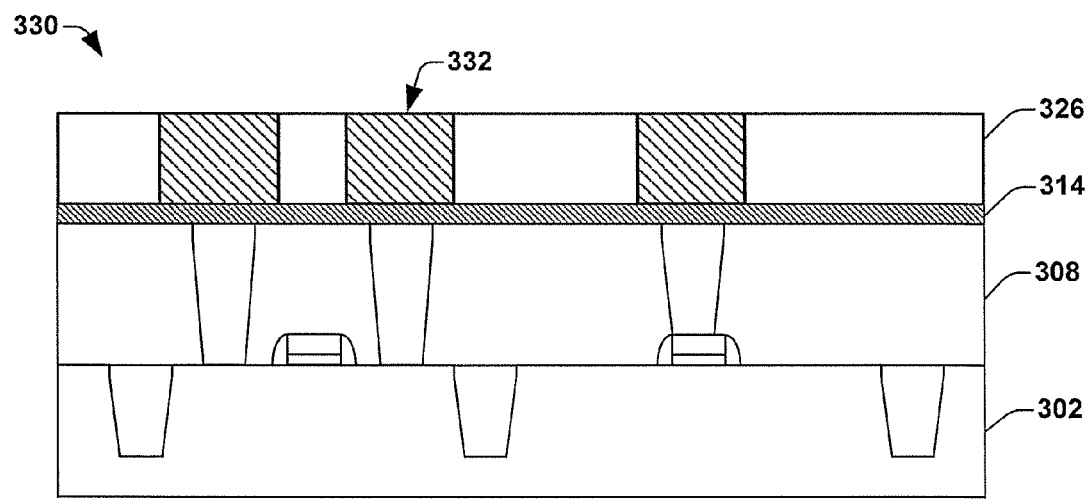

FIG. 3E illustrates a cross-sectional view of a semiconductor substrate 330 having metal layer structures formed from the metal layer 332 and the UMM layer 314 to fill cavities (e.g., 320 of FIG. 3C) in the pattered photoresist layer 326. It will be appreciated that the metal layer structures may be formed to a thickness that is greater than the design specification of the metallization layer. For example, to generate a copper metal line having a design specified thickness of 50 nm copper metal may be plated to a thickness of 60 nm. The extra thickness can be subsequently removed by etching (e.g., step 212) and/or by chemical mechanical polishing (e.g., step 218).

The patterned photoresist layer is removed from the substrate, at 210. Stripping the patterned photoresist layer from the substrate leaves freestanding metal layer structures (i.e., metal layer structures not surrounded by dielectric material), as defined by the cavities of the patterned photoresist layer. In one embodiment, the patterned photoresist layer is stripped using a plasma etching process, as is well known in the art. In an alternative embodiment the patterned photoresist layer is stripped using a wet etch process, as is well known in the art.

In one embodiment (not shown), a post metallization anneal may be performed on the metal layer structures after the patterned photoresist layer is removed. As is well known in the art, the post metallization anneal may be used to accelerate grain growth in copper, thereby improving the mechanical and electrical properties of the metal layer structures.

At 212, exposed portions of the UMM layer are removed from the substrate. The UMM layer is removed from areas where the UMM layer is not covered by plated metal (e.g., UMM layer is removed between the plated metal layer structures). In one embodiment, a wet etching process is used to etch away the UMM layer. The wet etch may utilize an etchant comprising a diluted hydro-flouride (HF) solution, for example. In one embodiment, wherein the metal layer structures are formed to a height greater than the design specified height, the UMM etch is performed without masking the metal layer structures. Such an etch reduces the height of the metal layer structures, but will not have any other detrimental effect on the back-end-of-the-line metallization.

At 214, a diffusion barrier layer is deposited onto the substrate surface above the metal layer structures. The diffusion barrier layer conforms to the surface of the structure, coating the top and sidewalls of the metal layer structure. In one embodiment, the diffusion barrier layer may be deposited on the surface of the substrate using a reactive sputter deposition. In alternative embodiments, a chemical vapor deposition (CVD) or plasma enhanced CVD method may be used to deposit the diffusion barrier layer. In one embodiment, the diffusion barrier layer may comprise a nitride diffusion barrier layer such as TaSiN, TiSiN, TaAlN, Ta, TaN, or HfN, for example.

Figure 3F:
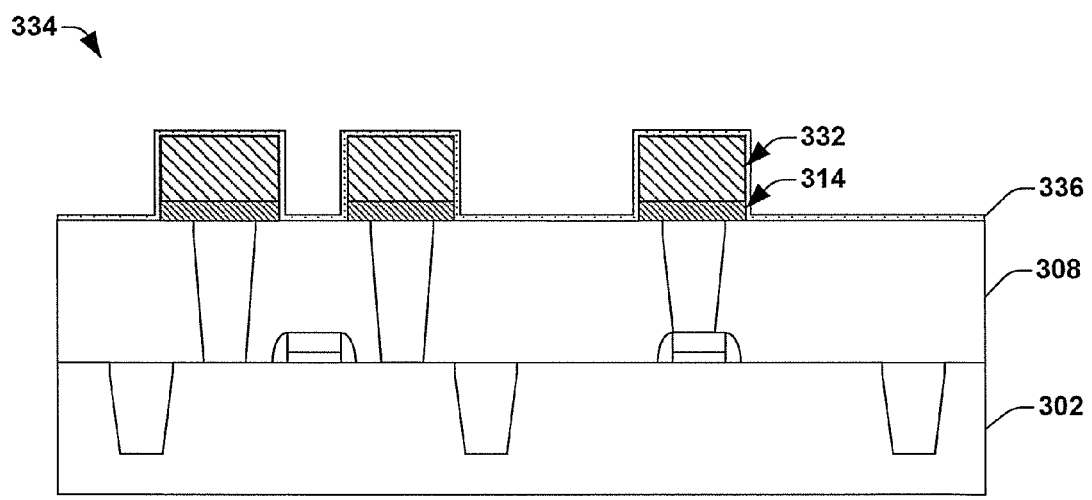

FIG. 3F illustrates a cross sectional view 334 of a semiconductor substrate having undergone acts 210-214. As shown in FIG. 3F, the metal layer structures, comprising 314 and 332, form freestanding structures. A diffusion barrier layer 336 is disposed over the surface of the substrate, including the tops and side walls of the metal layer structures, 314 and 332.

At 216, an inter-level dielectric material is deposited onto the surface of the substrate and cured. The inter-level dielectric material is formed over the substrate. In one embodiment, the inter-level dielectric material may comprise an ultra low-k (ULK) spin-on glass (e.g., having a dielectric constant, k~2.2). Such a ULK spin-on glass (SOG) is an inter-level dielectric material that can be applied to a substrate in liquid form. The ULK spin-on glass may be deposited onto the surface of the substrate by spin coating and fills in areas between metallization structures, resulting in a substantially planarized ultra low-k dielectric material formed around existing metal and/or contact structures. The use of a ULK spin-on glass dielectric avoids dielectric etching that enhances nodule shapes that cause metal line distortion, formed by standing wave of incoming and outgoing light used in photolithography processes.

After the ULK spin-on glass is spun onto the surface of the substrate it is annealed to cure the ULK spin-on glass. Because the thickness of a spun on inter-level dielectric material for single damascene process is far thinner than the thickness of a spun on inter-level dielectric material for a dual damascene process, curing of the ULK spin-on glass is improved relative to a dual damascene process. In one embodiment, the ULK spin-on glass may cured by performing an anneal at a temperature of around 200-300° C. for a time of about 15 to 30 minutes. In other embodiments, different annealing processes may be used.

Figure 3G:
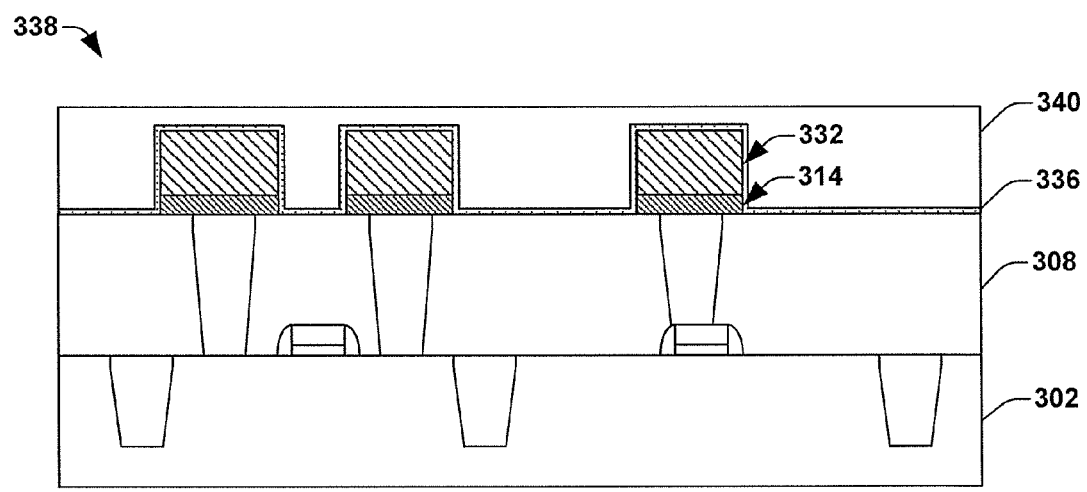
Figure 3H:
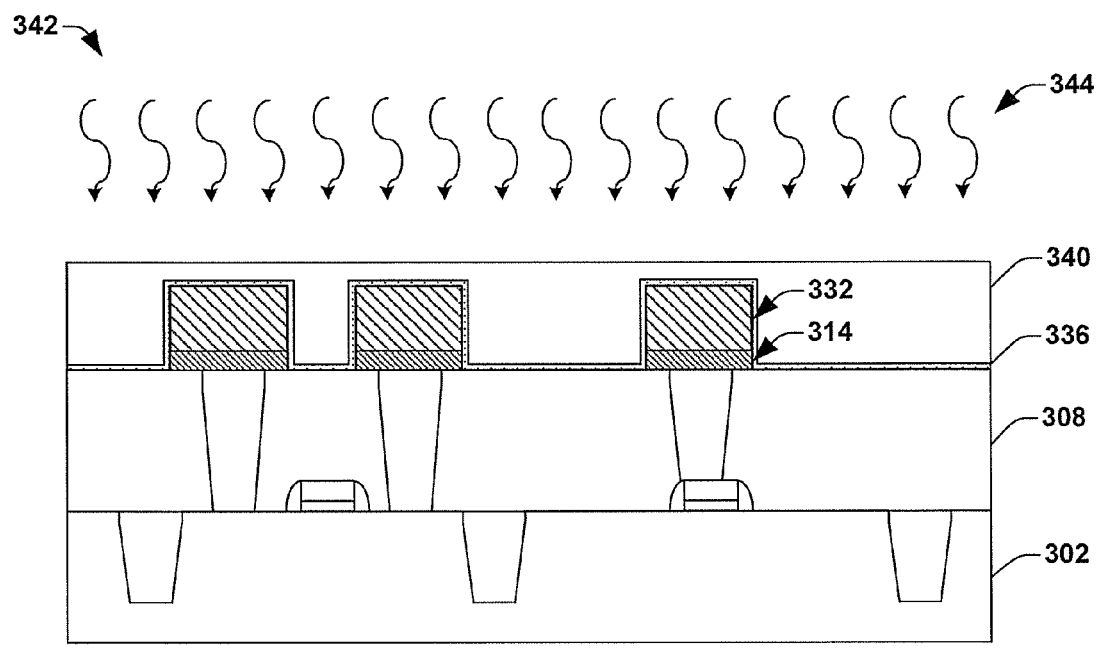

FIG. 3G illustrates a cross sectional view of a semiconductor substrate 338 having an inter-level dielectric material 340. As shown in FIG. 3G, the inter-level dielectric material 340 fills in the area between the freestanding metal layer structures, comprising 314 and 332, so as to enclose the metal layer structures. Since the inter-level dielectric material 340 is formed above the diffusion barrier layer 336, diffusion of the copper metal into the inter-level dielectric material 340 is prevented. FIG. 3H illustrates a cross sectional view 342 of an anneal 344 of the substrate to cure the spin-on dielectric material 340.

The substrate is planarized, at 218. Planarization of the substrate may comprise chemical mechanical polishing (CMP) of the substrate. CMP globally planarizes the surface of the substrate by removing excess metal, dielectric material, and/or the barrier layer. Since the height of the metal layer and the spin on dielectric material can be well controlled and since the spin-on inter-level dielectric material forms a relatively planar surface, the CMP process may use a relatively small amount of the a high pH (base solution) solution generally used to polish the surface of the wafer.

Figure 3I:
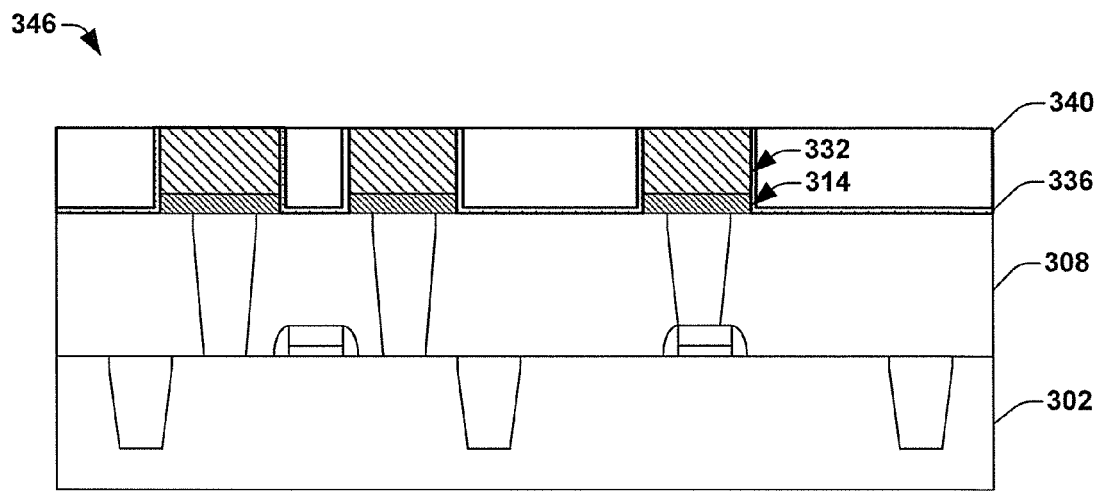

FIG. 3I illustrates a cross sectional view of a planarized semiconductor substrate 346. Planarization removes excess of metal layer 332, dielectric material 340, and diffusion barrier layer 336, resulting in an exposed planar metallization layer, upon which subsequent metallization layers may be formed.

In one embodiment, the CMP process may be used to reduce the height of metal layer structure and inter-level dielectric material to a height appropriate for the metal layer. For example, planarization may be used to remove excess copper, grown in step 208 to a height of 250 nm, to form a thin to form a thin metallization layer having a design height (on wafer height) of 200 nm.

It will be appreciated that method 200 may be iteratively performed during formation of a back-end-of-the-line metallization stack comprising a plurality of metallization layers.

Figure 4:
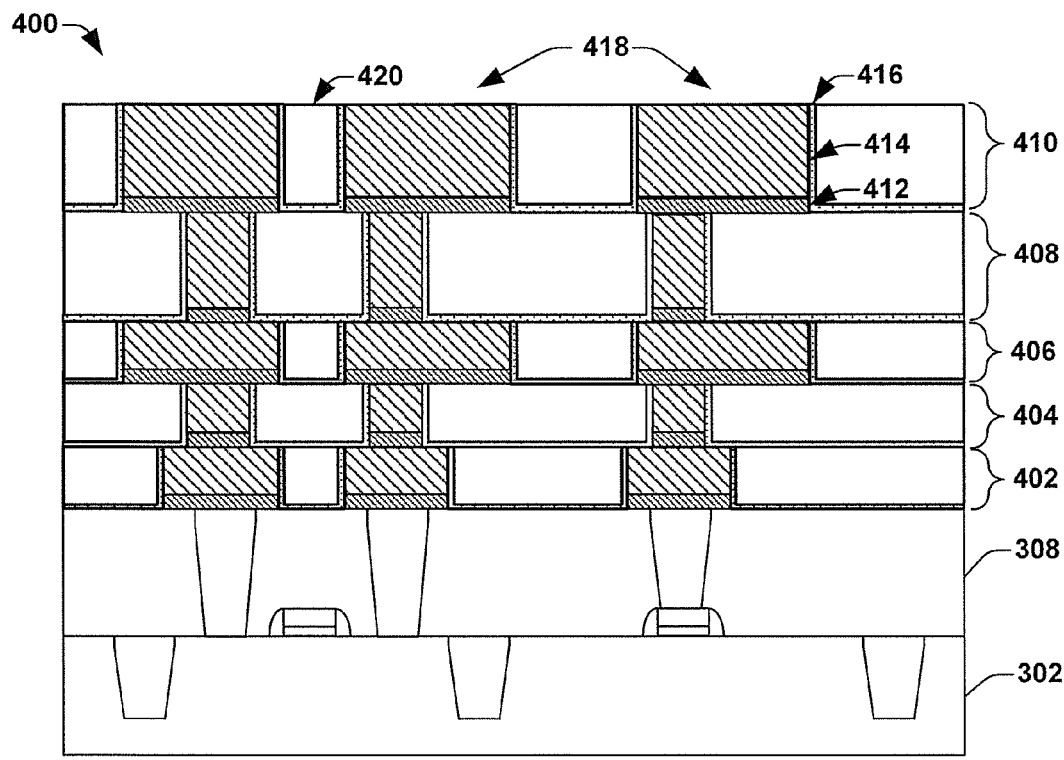
FIG. 4 is a cross-sectional view of an example semiconductor substrate having a back-end-of-the-line metal stack formed using a reverse damascene process as provided herein.

FIG. 4 illustrates a cross sectional view of a substrate 400 having a plurality of metal layers formed according to methods disclosed herein (e.g., methods 100, 200, and/or 500). The resulting substrate 400 comprises a first thin metal layer 402 (i.e., a metal 1 layer) formed according to a first iteration of a method. The substrate 400 further comprises second thin metal layer 404 comprising a via/contact layer (i.e., a via 1 layer) vertically coupled to the underlying first thin metal layer 402, and third thin metal layers 406 vertically coupled to the underlying second thin metal layer 404. The substrate 400 also comprises thicker metal layers 408 and 410, formed according to the same methods.

Referring again to FIG. 4, the formation of metallization layers by the disclosed reverse damascene process (e.g., method 100, 200, and/or 500) may be physically differentiated from the cross section of back-end-of-the-line metallization layers formed by a typical dual or single damascene processes. As shown in FIG. 4, a UMM layer 412 extends along only the bottom surface of the metal layer structures 418, while a diffusion barrier layer 416 is formed along the sidewalls of the metal layer structures 418. This is because the UMM layer 412 is deposited prior to the deposition of the diffusion barrier layer 416 and the inter-level dielectric material 420. This allows for a non-continuous diffusion barrier along the surface of the metal layer structures 418.

For example, in one embodiment, where a nitride-free UMM layer 412 has a barrier function and the diffusion barrier layer is formed using a nitride based diffusion barrier layer (e.g., TiN, TaSiN, TiSiN, TaAlN, TaN, HfN, etc.), the UMM layer 412 will extend along only the bottom surface of the metal layer structures 418 while a nitride based diffusion barrier layer 416 will extend only along the top and sides of the metal layer structures 418. In another embodiment, a nitride-free dielectric film, disposed below the UMM layer 412, will extend along only the bottom surface of the metal layer structures 418 while a nitride based diffusion barrier layer will 416 extend only along the top and sides of the metal layer structures 418. In contrast, during a usual damascene process (e.g., as described above in the background section) the cavity is drilled first and then a barrier layer is formed, causing the same diffusion barrier layer to be formed on the bottom and sides of a metal layer structure.

Figure 5:
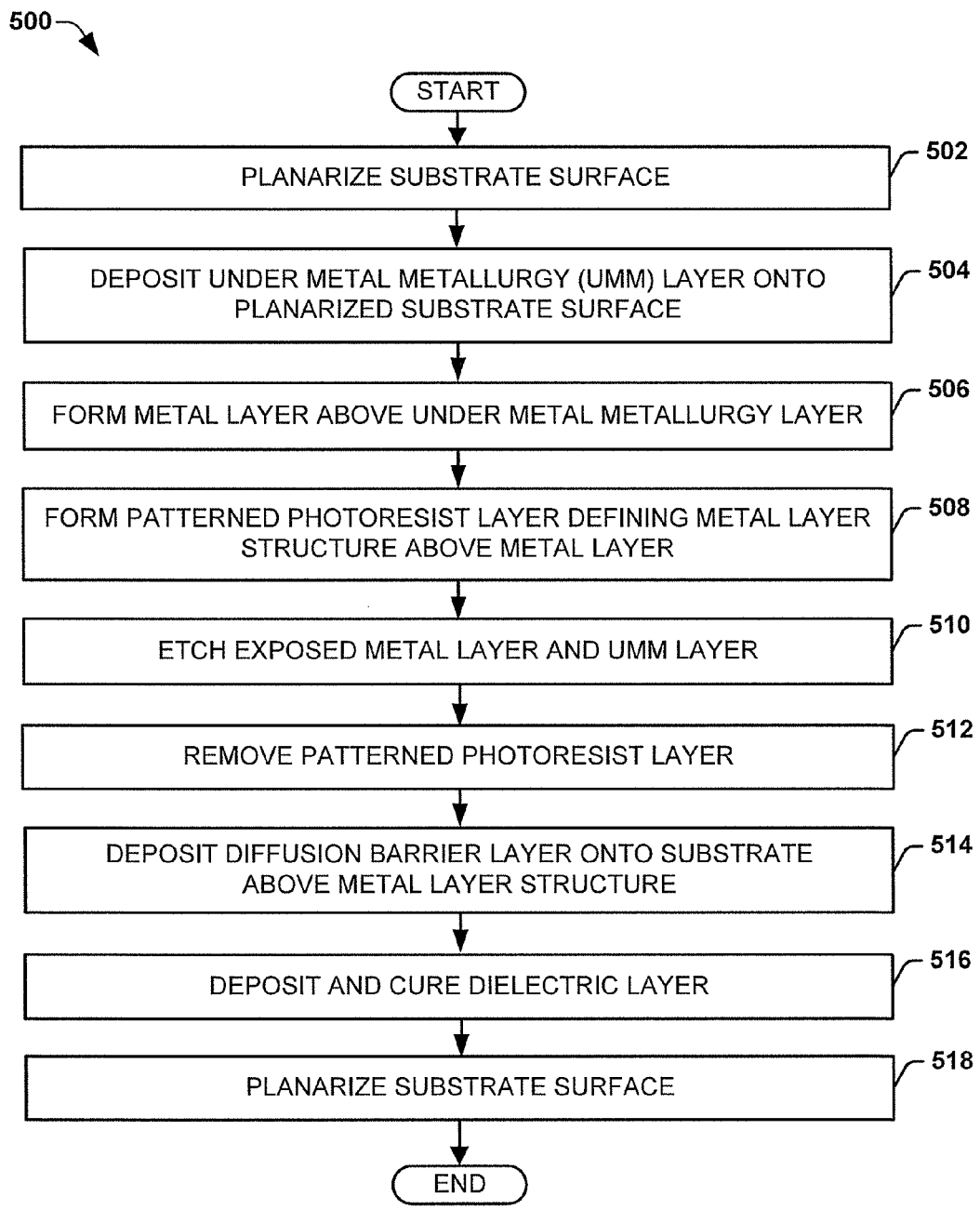
FIG. 5 is a flow diagram illustrating an alternative example methodology for forming a metallization layer using a reverse damascene process provided herein.

FIG. 5 illustrates an alternative embodiment of a method 500 for forming a single back-end-of-the-line metallization layer using a reverse damascene process. An example semiconductor substrate whereon such a methodology is implemented is illustrated in cross-sectional view in FIGS. 6A-6D.

One of ordinary skill in the art will appreciate that the method 500 may be beneficial for metallization layers formed from aluminum (e.g., typically found in wider metal lines) since aluminum is often patterned by an etch process, as opposed to copper which is typically patterned using a damascene approach. However, as one of ordinary skill in the art will appreciate, the use of method 500 is not limited to aluminum back-end-of-the-line metallization layers.

At 502, the surface of semiconductor substrate is planarized. In one embodiment, the surface of the semiconductor substrate may be planarized using a CMP process to remove excess material from the surface of the semiconductor substrate.

At 504, an under metal metallurgy (UMM) layer is deposited on the planarized substrate surface.

At 506, a metal layer is formed on the substrate above the UMM layer. In one embodiment, a metal layer is grown from the UMM layer using an electroplating method as described above. The metal layer may comprise a copper metal layer or an aluminum metal layer, for example. It will be appreciated that the metal layer may be formed to a thickness that is greater than the design specification of the metallization layer. For example, to generate a copper metal line having a design specified thickness of 50 nm copper metal may be plated to a thickness of 60 nm. The extra thickness can be subsequently removed by etching (e.g., step 512) and/or by chemical mechanical polishing (e.g., step 518).

In one embodiment, a post metallization anneal may be performed on the metal layer. The post metallization anneal may be used to accelerate grain growth in the metal, thereby improving the mechanical and electrical properties of the metal layer.

At 508, photoresist layer is deposited onto the surface of the substrate and is patterned to define a platting area where a metal layer structure (e.g., the via or metal line) is to be formed. The patterned photoresist layer acts as a mask that protects an underlying area of the metal layer that is to be formed into a metal layer structure. Therefore, in contrast to the method 200, wherein the patterned photoresist layer is used as a mold in which plated metal is grown, the patterned photoresist layer formed at 508 acts as an etch mask to the underlying metal. In other words, method 500 utilizes a selective etch of the metal to form a metal layer structure defined by the patterned photoresist layer, while method 200 utilizes a patterned photoresist layer as a mold to form a metal layer structure defined by the patterned photoresist layer.

Figure 6A:
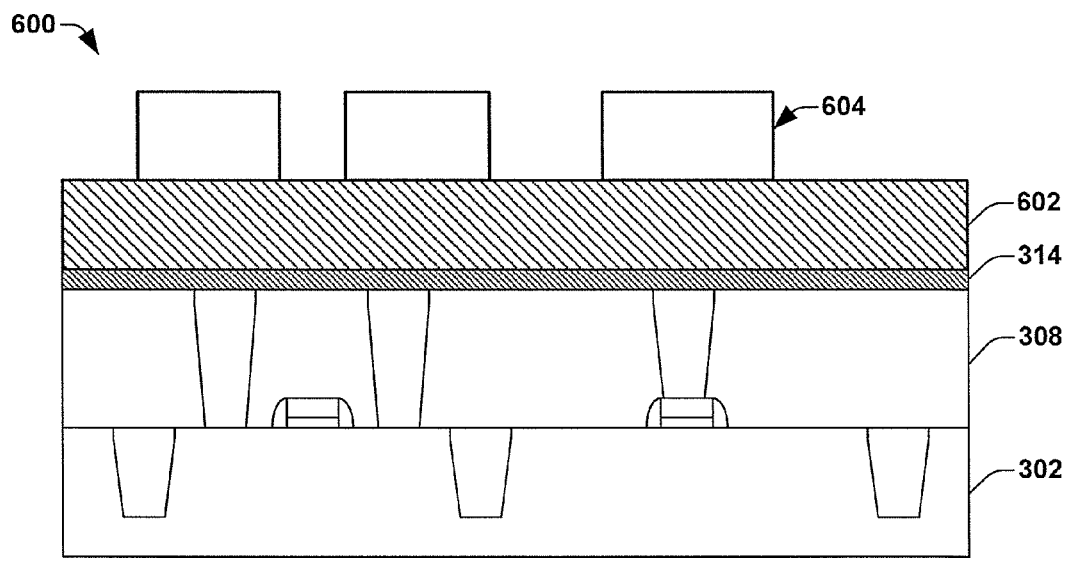
FIGS. 6A-6D are cross-sectional views of an example semiconductor substrate upon which a back end metallization layer is formed using the method of FIG. 5.

FIG. 6A illustrates a cross sectional view of a semiconductor substrate 600 having a patterned photoresist layer 604 located above a metal layer 602 and a UMM layer 314. The patterned photoresist layer 604 is formed above the metal layer 602 in areas where the metal layer 602 will form wire or via structures (i.e., the patterned photoresist layer 616 has cavities that define where the underlying metal layer 602 and UMM layer 314 are to be etched away).

At 510, the metal layer and UMM layer underlying the patterned photoresist layer is selectively etched. The selective etch removes exposed areas of the metal layer and the underlying UMM layer that are not covered by the masking patterned photoresist layer. In one embodiment, the metal layer may be etched by a wet etching process using an etchant comprising HF.

The patterned photoresist layer is removed, at 512. Removal of the patterned photoresist layer leaves freestanding metal layer structures, comprising the metal layer and the UMM layer remaining after the etch.

Figure 6B:
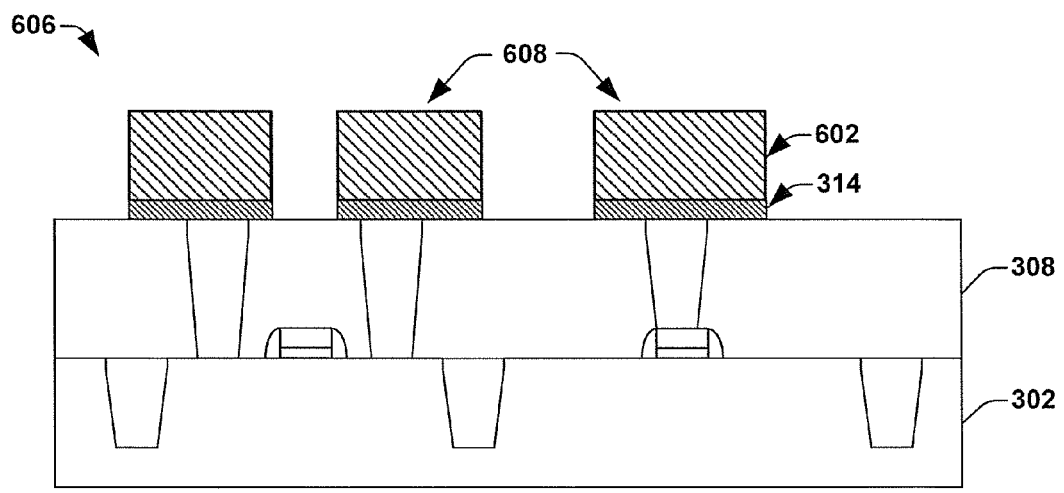

FIG. 6B illustrates a cross sectional view of a semiconductor substrate 606 having metal layer structures 608 patterned by etching the substrate with the patterned photoresist layer present. As shown in FIG. 6B, the metallization layer, comprising 314 and 602, is in the location where the patterned photoresist layer was (e.g., 616 in FIG. 6A) and result are freestanding metal layer structures.

At 514, a diffusion barrier layer is deposited onto the substrate surface above the metallization layer. In various embodiments, the diffusion layer may be deposited on the surface of the using a reactive sputter deposition, a chemical vapor deposition (CVD), or plasma enhanced CVD method.

Figure 6C:
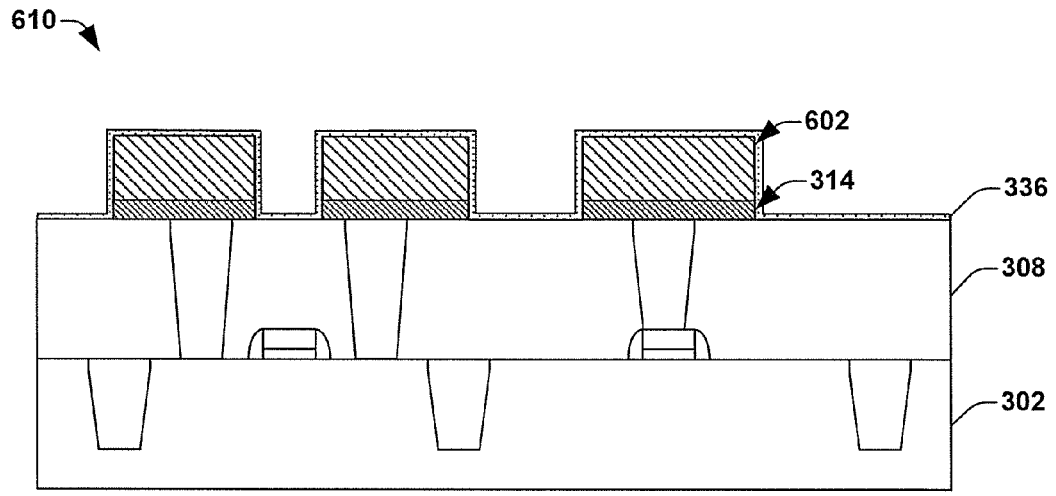

FIG. 6C illustrates a cross sectional view of a semiconductor substrate 610 having a diffusion barrier layer 336. The diffusion barrier layer 336 is disposed over the surface of the substrate to conform to the tops and side walls of the metal layer structures.

At 516, an inter-level dielectric material is deposited onto the surface of the substrate and cured. In one embodiment, the inter-level dielectric material may comprise a spin-on dielectric material that fills in the area between metal layer structures so as to form a dielectric material around existing metal and contact structures.

Figure 6D:
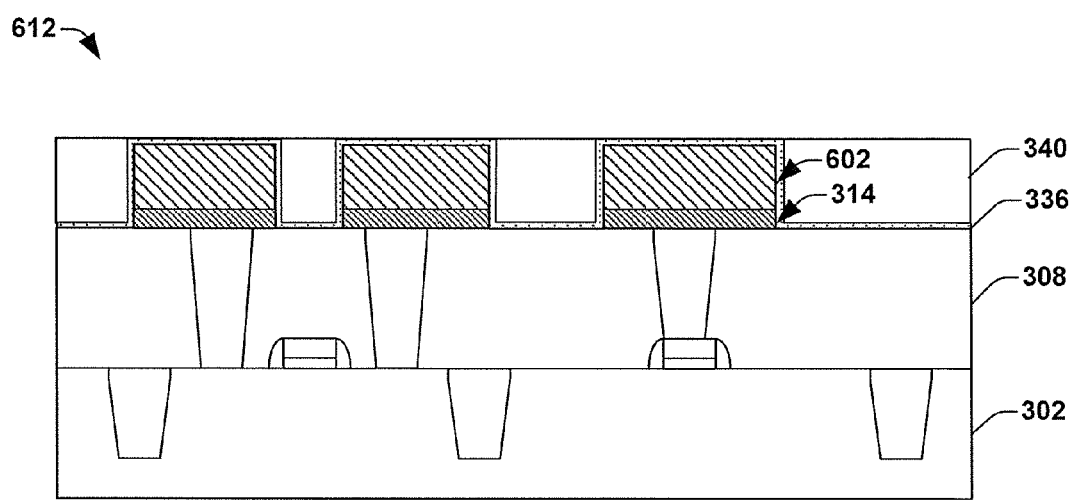

The substrate is planarized, at 518. FIG. 6D illustrates a cross sectional view of a planarized semiconductor substrate 612 having a metallization layer formed using the reverse damascene process of method 500.

It will be appreciated that method 500 may be iteratively performed to form multiple metallization layers in a back-end-of-the-line stack. In one embodiment, methods 200 and 500 may be used in combination to form a back end of the line stack. For example, method 200 may be used to form thin metal copper layers, while method 500 may be used to form thicker aluminum layers.

It will be appreciated that the term "metallization layer" as referred to herein may denote any integrated chip back-end-of-the-line metal structures. For example, a metallization layer may comprise a metal line (extending parallel to the surface of the substrate) or via/contact (extending substantially perpendicular to the surface of the chip to vertically connecting metallization layers) structures used to connect IC devices to an external environment. The metallization layer may also comprise metal structures used in back-end-of-the-line passive devices (e.g., such as capacitors or inductors), for example.

It will also be appreciated that, substrate and/or semiconductor substrate as used herein may comprise any type of semiconductor body (e.g., silicon, SiGe, SOI) such as a semiconductor wafer and/or one or more die on a wafer, as well as any other type of semiconductor and/or epitaxial layers associated therewith. Also, while reference is made throughout this document to exemplary structures in discussing aspects of methodologies described herein (e.g., those structures presented in FIGS. 3, 4, and 6 while discussing the methodology set forth in FIGS. 2 and 5), that those methodologies are not to be limited by the corresponding structures presented. Rather, the methodologies (and structures) are to be considered independent of one another and able to stand alone and be practiced without regard to any of the particular aspects depicted in the Figs. Additionally, layers described herein, can be formed in any suitable manner, such as with spin on, sputtering, growth and/or deposition techniques, etc.

Also, equivalent alterations and/or modifications may occur to those skilled in the art based upon a reading and/or understanding of the specification and annexed drawings. The disclosure herein includes all such modifications and alterations and is generally not intended to be limited thereby. In addition, while a particular feature or aspect may have been disclosed with respect to only one of several implementations, such feature or aspect may be combined with one or more other features and/or aspects of other implementations as may be desired. Furthermore, to the extent that the terms "includes", "having", "has", "with", and/or variants thereof are used herein, such terms are intended to be inclusive in meaning—like "comprising." Also, "exemplary" is merely meant to mean an example, rather than the best. It is also to be appreciated that features, layers and/or elements depicted herein are illustrated with particular dimensions and/or orientations relative to one another for purposes of simplicity and ease of understanding, and that the actual dimensions and/or orientations may differ substantially from that illustrated herein.

What is claimed is:

1. A method for forming a metallization layer, comprising:
   depositing an under metal metallurgy (UMM) layer on a first copper barrier layer over a surface of a semiconductor substrate;
   forming a patterned photoresist layer above the UMM layer having one or more cavities extending from a top to a bottom of the patterned photoresist layer;
   forming a single metal layer from the UMM layer within the one or more cavities;
   patterning the UMM layer after forming the single metal layer to form a plurality of first metal layer structures;
   forming a nitride based diffusion barrier layer comprising a different material than the first copper barrier layer, wherein the nitride based diffusion barrier layer conforms to top and side surfaces of the plurality of first metal layer structures, continuously extends between adjacent ones of the plurality of first metal layer structures, and has a top surface aligned with top surfaces of the plurality of first metal layer structures;
   forming an inter-level dielectric material onto the surface of the semiconductor substrate to fill areas between the plurality of first metal layer structures, wherein the inter-level dielectric material has a top surface aligned with the top surface of the nitride based diffusion barrier layer; and
   forming a plurality of second metal layer structures on a second copper barrier layer arranged on the plurality of first metal layer structures, so that the plurality of first metal layer structures are separated from the plurality of second metal layer structures by the second copper barrier layer.

2. The method of claim 1, wherein forming the inter-level dielectric material on the surface of the semiconductor substrate comprises spin coating the inter-level dielectric material.

3. The method of claim 1, further comprising:
   performing a planarization process to remove parts of the nitride based diffusion barrier layer on top surfaces of the plurality of first metal layer structures and to remove parts of the inter-level dielectric material.

4. The method of claim 1, further comprising:
   forming the nitride based diffusion barrier layer to abut top and side surfaces of the single metal layer and side surfaces of the UMM layer after forming the plurality of first metal layer structures.

5. The method of claim 1, further comprising:
   removing the patterned photoresist layer and the UMM layer from the semiconductor substrate in areas where the UMM layer is not covered by the single metal layer, so that sidewalls of the UMM layer are aligned with sidewalls of the single metal layer.

6. The method of claim 1, wherein the single metal layer is a metal via layer configured to make a vertical connection between an underlying metal wire layer and an overlying metal wire layer.

7. The method of claim 1, wherein the nitride based diffusion barrier layer abuts an underlying inter-level dielectric (ILD) layer.

8. The method of claim 1, wherein a bottom surface of the nitride based diffusion barrier layer is substantially co-planar with a bottom surface of the UMM layer.

9. The method of claim 1, wherein the first copper barrier layer has an upper surface that is in continuous contact with a lower surface of the UMM layer along an interface that laterally extends below the patterned photoresist layer and the one or more cavities.

10. The method of claim 9, wherein the first copper barrier layer comprises silicon oxycarbide (SiOCH).

11. A method for forming a metallization layer, comprising:
    depositing an under metal metallurgy (UMM) layer on a first copper barrier layer over a semiconductor substrate;
    growing a single metal layer on and in direct contact with the UMM layer;
    forming a patterned photoresist layer on and in direct contact with an upper surface of the single metal layer, wherein the patterned photoresist layer has one or more cavities extending from a top to a bottom of the patterned photoresist layer;
    selectively etching the single metal layer and the UMM layer in areas not masked by the patterned photoresist layer to form a plurality of first metal layer structures shaped by the one or more cavities in the patterned photoresist layer;
    forming a nitride based diffusion barrier layer comprising a different material than the first copper barrier layer, that conforms to top and side surfaces of the single metal layer and side surfaces of the UMM layer, and that extends between adjacent ones of the plurality of first metal layer structures, wherein the nitride based diffusion barrier layer has a top surface that is aligned with top surfaces of the plurality of first metal layer structures;
    forming an inter-level dielectric material to fill areas between the plurality of first metal layer structures, wherein the inter-level dielectric material has a top surface aligned with the top surface of the nitride based diffusion barrier layer; and
    forming a plurality of second metal layer structures on a second copper barrier layer arranged on the plurality of first metal layer structures, so that the plurality of first metal layer structures are separated from the plurality of second metal layer structures by the second copper barrier layer.

12. The method of claim 11, wherein forming the inter-level dielectric material comprises spin coating the inter-level dielectric material.

13. The method of claim 11, further comprising:
    performing a planarization process to remove parts of the nitride based diffusion barrier layer on top surfaces of the plurality of first metal layer structures and to remove parts of the inter-level dielectric material.

14. The method of claim 11, wherein the first copper barrier layer has an upper surface that is continuously in direct contact with a lower surface of the UMM layer along an interface that laterally extends below the patterned photoresist layer and the one or more cavities.

15. The method of claim 11, wherein the inter-level dielectric material comprises an ultra low-k spin-on glass dielectric material.

16. The method of claim 11, further comprising:
removing the UMM layer from the semiconductor substrate in areas where the UMM layer is not covered by the single metal layer, so that sidewalls of the UMM layer are aligned with sidewalls of the single metal layer.

17. The method of claim 11, wherein the single metal layer is a metal via layer configured to make a vertical connection between an underlying metal wire layer and an overlying metal wire layer.

18. The method of claim 11, further comprising:
reducing a thickness of the first plurality of metal layer structures after removing the patterned photoresist layer.

19. A method for forming a metallization layer, comprising:
forming a first copper barrier layer onto a lower inter-level dielectric layer overlying a semiconductor substrate;
depositing an under metal metallurgy (UMM) layer on the first copper barrier layer;
forming a masking layer above the UMM layer, which has one or more openings exposing the UMM layer, wherein the first copper barrier layer has an upper surface that is continuously in direct contact with a lower surface of the UMM layer along an interface that laterally extends below the masking layer and the one or more openings;
growing a single metal layer from the UMM layer in the one or more openings;
removing the masking layer;
patterning the UMM layer to remove the UMM layer in areas not covered by the single metal layer and to form a plurality of first metal layer structures comprising the single metal layer and the UMM layer;
forming a nitride based diffusion barrier layer, comprising a different material than the first copper barrier layer, wherein the nitride based diffusion barrier layer conforms to top and side surfaces of the plurality of first metal layer structures, and continuously extends between adjacent ones of the plurality of first metal layer structures;
forming an inter-level dielectric (ILD) material in areas between the plurality of first metal layer structures;
performing a planarization process to remove parts of the nitride based diffusion barrier layer, the plurality of first metal layer structures, and the inter-level dielectric (ILD) material; and
forming a plurality of second metal layer structures on a second copper barrier layer arranged on the plurality of first metal layer structures, so that the plurality of first metal layer structures are separated from the plurality of second metal layer structures by the second copper barrier layer.

20. The method of claim 19, further comprising:
forming the nitride based diffusion barrier layer to continuously extends along sidewalls of the UMM layer and the single metal layer to a position abutting the lower inter-level dielectric layer.

* * * * *